United States Patent [19]
Honda et al.

[11] Patent Number: 5,811,806
[45] Date of Patent: Sep. 22, 1998

[54] ELECTRON-BEAM BIPRISM

[75] Inventors: Toshikazu Honda; Masaki Takeguchi, both of Tokyo; Takeshi Tomita, Ogawahigashi, all of Japan

[73] Assignee: Jeol Ltd., Tokyo, Japan

[21] Appl. No.: 713,962

[22] Filed: Sep. 12, 1996

[30] Foreign Application Priority Data

Sep. 12, 1995 [JP] Japan .................................. 7-233143

[51] Int. Cl.$^6$ .................................................. H01J 37/00
[52] U.S. Cl. ........................................ 250/311; 250/306
[58] Field of Search ..................................... 250/306, 311

[56] References Cited

U.S. PATENT DOCUMENTS

| | | | |
|---|---|---|---|
| 4,133,702 | 1/1979 | Krimmel | 250/492.21 |
| 4,935,625 | 6/1990 | Hasegawa et al. | 250/311 |
| 4,998,788 | 3/1991 | Oskakabe et al. | 250/311 |
| 5,192,867 | 3/1993 | Osakabe et al. | 250/311 |
| 5,466,548 | 11/1995 | Matsui | 250/306 |

OTHER PUBLICATIONS

"Anti–Contamination Electron Biprism for Electron Holography", Ken Harada et al., *J. Electron Microsc.*, vol. 37, No. 4, pp. 199–201, 1988.

*Primary Examiner*—Bruce Anderson
*Attorney, Agent, or Firm*—Webb Ziesenheim Bruening Logsdon Orkin & Hanson, P.C.

[57] ABSTRACT

There is disclosed an electron-beam biprism for use in an electron-beam holographic interference microscope. The biprism comprises a rotary plate having a hole permitting passage of an electron beam, a biprism wire mounted to the rotary plate and electrically insulated from the rotary plate, a holder, a rotating mechanism, a heating mechanism for heating the biprism wire, a voltage source for applying a voltage to the biprism wire, and a pair of grounding electrodes extending parallel to the biprism wire which bridges across the hole. The rotary plate is rotatably held by the holder so as to be rotatable about the hole. The grounding electrodes are mounted to the rotary plate. The biprism wire is sandwiched between the grounding electrodes.

6 Claims, 2 Drawing Sheets

ELECTRON-BEAM BIPRISM

FIELD OF THE INVENTION

The present invention relates to an electron-beam biprism for use in an electron-beam holographic interference microscope or the like for observing the difference in progress of phase between electron beams transmitted through a specimen.

BACKGROUND OF THE INVENTION

FIG. 1(a) is a diagram illustrating an electron-beam holographic interference microscope, and in which an electron-beam biprism incorporated in the microscope is not in operation. FIG. 1(b) is a diagram similar to FIG. 1(a) but in which the biprism is in operation.

Referring to FIG. 1(a), when the electron-beam biprism is not operated, the electron-beam holographic interference microscope operates in the manner described below. An electron beam 1 is produced by an electron gun (not shown) and impinges on a specimen 2. The electron beam transmitted through the specimen 2 is focused by an objective lens 3. The electron-beam biprism, indicated by numeral 4, is disposed under the objective lens 3. This electron-beam biprism 4 comprises a conductive wire 4a having a diameter of less than 1 μm, a voltage source 4b for applying a positive voltage of about 100 V, for example, to the wire 4a, a switch 4c for turning on and off the application of the voltage to the wire 4a from the voltage source 4b voltage source 4b, grounding electrodes 4d and 4e disposed on opposite sides of the wire 4a and a rotating mechanism (not shown) for rotating the wire 4a about the optical axis 0 of the electron beam. The wire 4a is stretched so as to intersect the passage of the electron beam perpendicularly. The grounding electrodes 4d and 4e extend parallel to the wire 4a.

In the condition illustrated in FIG. 1(a), the switch 4c is connected with ground and so the voltage from the voltage source 4b is not applied to the wire 4a. Rather, ground potential is applied to the wire 4a. Therefore, the electron beam focused by the objective lens 3 undergoes no deflecting action in passing through the electron-beam biprism 4. A fluorescent plate 5 is located under the biprism 4. A transmission electron image 2i of the specimen 2 and a shadow S of the wire 4a are formed on the fluorescent plate 5. The position of the specimen 2 is adjusted, and the angular position of the wire is adjusted by the rotating mechanism (not shown) in such a way that the transmission electron image 2i is created at only one side of the shadow S of the wire. This rotating mechanism is essential for the electron-beam holographic interference microscope.

FIG. 1(b) shows the condition in which the switch 4c is connected to the voltage source 4b so that the voltage from the voltage source 4b is impressed on the wire 4a. The electron beam is focused by the objective lens 3 and then arrives at opposite sides of the wire 4a. The two parts of the electron beam are then attracted toward the center by the positive voltage applied to the wire 4a and made to overlap each other under the wire, thus creating electron beam interference fringes on the fluorescent plate.

If the wire 4a of the electron-beam biprism 4 is contaminated, the image quality of the electron beam interference fringes formed on the fluorescent plate deteriorates. A conceivable method of removing the contamination from the wire is to heat the wire by passing electrical current through it. However, any configuration capable of heating the wire by passing electrical current through the wire without hindering the operation of the rotating mechanism has not been accomplished at present.

SUMMARY OF THE INVENTION

In view of the foregoing circumstances, the present invention has been made.

It is an object of the present invention to provide an electron-beam biprism capable of removing contamination from the wire without hindering the operation of the mechanism for rotating the wire.

This object is achieved in accordance with the teachings of the invention by an electron-beam biprism for use with an instrument using an electron beam, said electron-beam biprism comprising: a rotary plate provided with a hole permitting passage of the electron beam; a biprism wire mounted to the rotary plate and bridging across the hole; a holder by which the rotary plate is rotatably held so as to be rotatable about the hole; a drive for rotating the rotary plate; an electrical circuit for heating the biprism wire; an electrical circuit for applying a voltage to the biprism wire; and grounding electrodes extending parallel to the biprism wire and mounted to the rotary plate in such a way that the biprism wire is positioned between and substantially parallel to the grounding electrodes.

The above-described object is also achieved by an electron beam biprism for use with an instrument using an electron beam, said electron-beam biprism comprising: a rotary plate provided with a hole permitting passage of the electron beam; a biprism wire mounted to the rotary plate and bridging across the hole; a holder by which the rotary plate is rotatably held so as to be rotatable about the hole; a drive for rotating the rotary plate; an electrical circuit for heating the biprism wire; and an electrical circuit for applying a voltage to the biprism wire. The rotary plate is grounded.

Other objects and features of the invention will appear in the course of the description thereof which follows.

DETAILED DESCRIPTION OF THE INVENTION

Figure 2A:
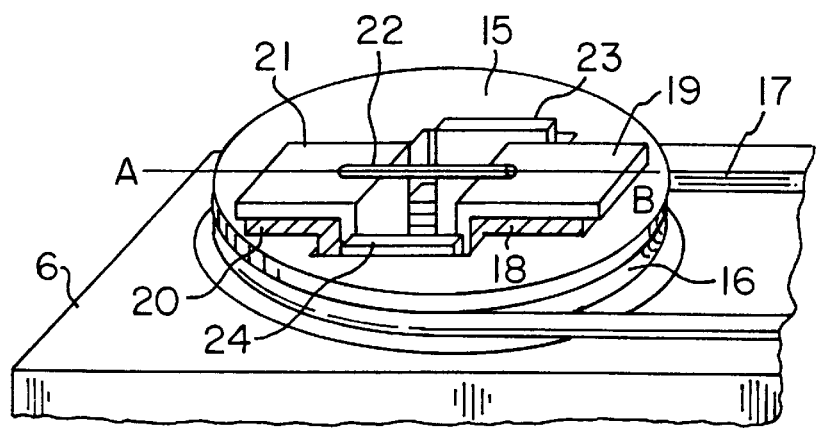
FIG. 2(a) is a perspective view of an electron-beam biprism according to the present invention.
Figure 2B:
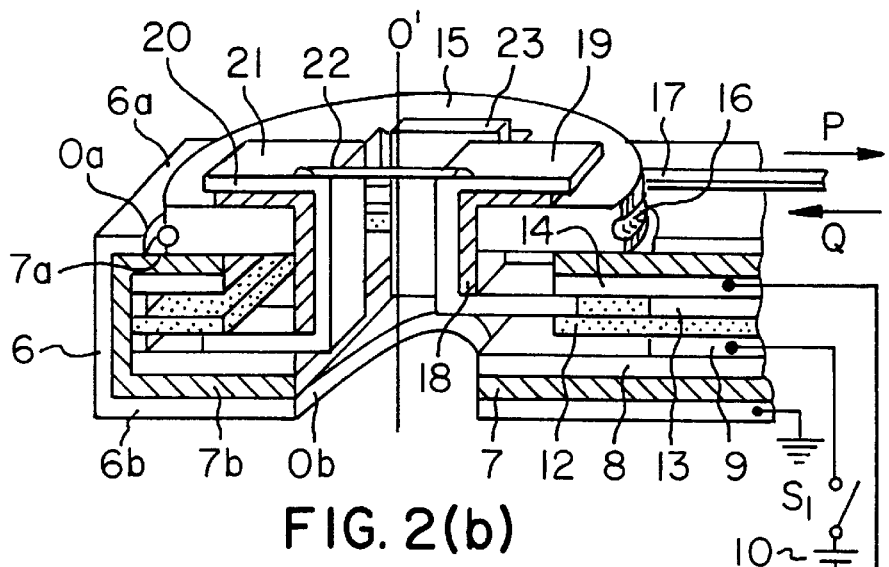
FIG. 2(b) is a cross-sectional view taken on line A–B of FIG. 2(a)

An electron-beam biprism according to the present invention is shown in FIGS. 2(a) and 2(b). FIG. 2(a) is a perspective view of the biprism. FIG. 2(b) is a cross-sectional view taken on line A–B of FIG. 2(a).

The biprism comprises a hollow box-like holder 6 having a top surface 6a. The top surface 6a is provided with a circular hole 0a. The holder 6 has a bottom surface 6b opposite to the top surface 6a. The bottom surface 6b is similarly provided with a circular hole 0b. The diameter of the hole 0a is greater than that of the hole 0b. An axis 0' passes through the hole 0a and is perpendicular to the top surface 6a. This axis 0' passes through the center of the hole 0b. The holder 6 is grounded.

An insulating member 7 consisting of a hollow box is fitted in the holder 6. The inner surface of the holder 6 is in contact with the outer surface of the insulating member 7. A square hole is formed in the top surface 7a of the insulating member 7. The bottom surface 7b opposite to the top surface 7a is similarly provided with a square hole. The length of one side of the hole in the top surface 7a is substantially intermediate between the diameters of the holes 0a and 0b. The length of one side of the bottom surface 7b is substantially equal to the diameter of the hole 0b. The centers of the square holes formed in the top surface 7a and bottom surface 7b are located on the axis 0'.

A first electrode plate 8 is placed on the bottom surface 7b of the insulating member 7. The first electrode plate 8 is provided with a square hole having the same size as the hole formed in the bottom surface 7b in the insulating member 7. The center of the hole in the first electrode plate 8 is located on the axis 0'.

A second electrode plate 9 is placed on the first electrode plate 8 and is formed with a square hole having sides of the same dimension as the diameter of the hole 0a. The center of this hole is positioned on the axis 0'. The second electrode plate 9 is connected via a switch $S_1$ with a power supply 10 for supplying electric power used for heating. The power supply 10 is connected with a voltage source 11 via another switch $S_2$.

An insulating plate 12 is placed on the second electrode plate 9 and is provided with a square hole of the same size as the hole formed in the top surface 7a of the insulating member 7. The center of this hole is located on the axis 0'.

A third electrode plate 13 having the same shape as the second electrode plate 9 is placed on the insulating plate 12. The center of the hole in the third electrode plate 13 is located above the axis 0'.

A fourth electrode plate 14 is placed on the third electrode plate 13 and is provided with a square hole having the same size as the hole formed in the top surface 7a of the insulating member 7. The center of this hole lies on the axis 0'. The surface of the fourth electrode plate 14 which faces away from the third electrode plate 13 is in contact with the top surface 7a of the insulating member 7. The fourth electrode plate 14 is connected with the voltage source 11 via the switch $S_2$.

A circular rotary plate 15 made of a conductive material such as a metal is fitted in the hole 0a in the holder 6. The rotary plate 15 is supported by the top surface 7a of the insulating member 7. A groove 16 is formed in the outer surface of the rotary plate 15. A conductive cable 17 used for rotation is stretched between the groove 16 and a pulley (not shown) mounted on the side of the holder. Ground potential is applied to the conductive cable 17 in the same way as the holder. The rotary plate 15 is provided with a square hole having the same size as the hole formed in the bottom surface 7b of the insulating member 7. The center of the hole is located on the axis 0'.

An L-shaped insulating member 18 is fixedly mounted at the center of one inner side of the hole formed in the rotary plate 15. The insulating member 18 is so mounted to the rotary plate 15 that the top surface of the insulating member 18 is in contact with the top surface of the rotary plate 15 and that the side surface of the insulating member 18 is in contact with the inner side of the hole created in the rotary plate 15. A U-shaped electrode 19 is secured to the L-shaped insulating member 18 in such a manner that the top surface of the electrode 19 is in contact with the top surface of the insulating member 18 and that the side surface is in contact with the side surface of the insulating member 18. The U-shaped electrode 19 has a lower portion having the same thickness as the third electrode plate 13, the lower portion being fitted between the insulating plate 12 and the fourth electrode plate 14. Similarly, a U-shaped electrode 21 is firmly fixed via an L-shaped insulating member 20 to the center of the inner side of the hole in the rotary plate 15 which is opposite to the U-shaped electrode 19. The length of the side surfaces of the insulating member 20 as measured in the direction of the axis 0' is somewhat greater than that of the insulating member 18. Also, the length of the side surfaces of the U-shaped electrode 21 as measured in the direction of the axis 0' is somewhat greater than that of the U-shaped electrode 19. The lower portion of the U-shaped electrode 21 which is longer than the U-shaped electrode 19 has the same thickness as the second electrode plate 9. This lower portion is fitted between the insulating plate 12 and the first electrode plate 8. A biprism wire 22 is tightly stretched between the top surface of the U-shaped electrode 19 and the top surface of the U-shaped electrode 21 so as to bridge across the electron beam passage in the rotary plate.

Figure 1A:
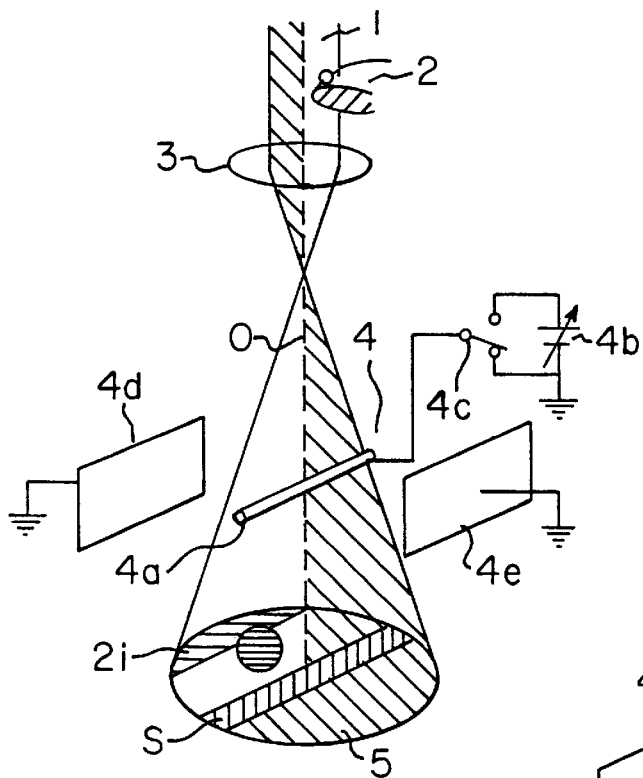
FIG. 1(a) is a diagram illustrating an electron-beam holographic interference microscope and in which an electron-beam biprism is not in operation.
Figure 1B:
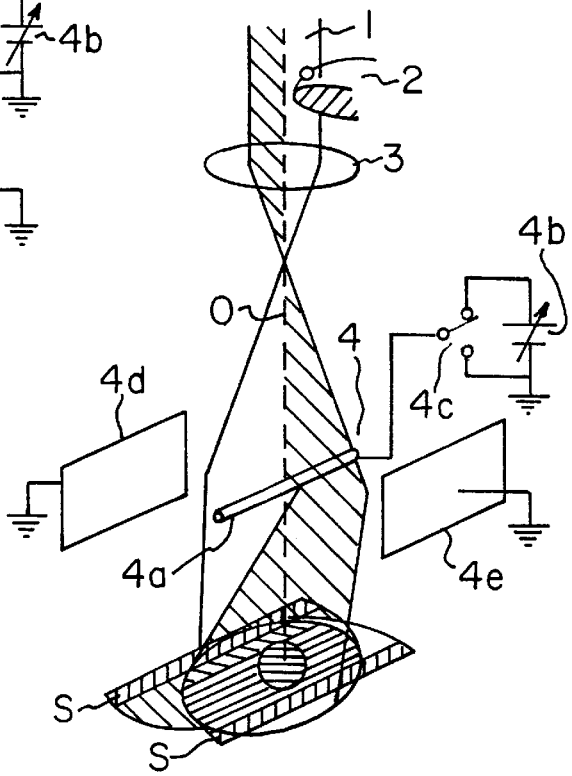
FIG. 1(b) is a diagram similar to FIG. 1(a) but in which the electron-beam biprism is in operation.

Grounding electrodes 23 and 24 are mounted to inner side surfaces of the hole in the rotary plate 15 and extend parallel to the biprism wire 22. The biprism wire 22 is sandwiched between the grounding electrodes 23 and 24. Since these grounding electrodes 23 and 24 are fixedly mounted to the rotary plate 15 which is connected with the rotating cable 17, the electrodes 23 and 24 are at ground potential. The structure of the electron-beam biprism shown in FIGS. 2(a) and 2(b) has been described thus far. This biprism is placed at the position of the electron-beam biprism 4 shown in FIGS. 1(a) and 1(b) such that the axis 0' shown in FIGS. 2(a) and 2(b) agrees with the optical axis 0 of the electron beam shown in FIGS. 1(a) and 1(b).

The operation of the electron-beam biprism shown in FIGS. 2(a) and 2(b) is next described. First, the case where the biprism wire 22 is rotated about the axis 0' is described. In order to rotate the biprism wire 22, the rotating cable 17 fitted in the groove 16 formed in the rotary plate 15 is moved in either direction indicated by the arrows P or Q shown in FIGS. 2(a) and 2(b). If the cable 17 is moved in the direction indicated by the arrow P, the rotary plate 15 turns in a clockwise direction about the axis 0'. On the other hand, if the cable 17 is moved in the direction indicated by the arrow Q, the rotary plate 15 rotates in a counterclockwise direction about the axis 0'. The rotation of the rotary plate 15 rotates the insulating members 18, 20, electrodes 19, 21 and biprism wire 22 mounted integrally with the rotary plate 15 about the axis 0'. During this rotation, the bottom surface of the U-shaped electrode 19 slides between the insulating plate 12 and the fourth electrode plate 14. The bottom surface of the U-shaped electrode 21 slides between the insulating plate 12 and the first electrode plate 8. Therefore, if the biprism wire 22 is oriented in any direction, the rotation of the rotary plate 15 causes the bottom surface of the U-shaped electrode 19 to slide between the insulating plate 12 and the fourth electrode plate 14. The bottom surface of the U-shaped electrode 21 slides between the insulating plate 12 and the first electrode plate 8.

The cable 17 used for the rotation may be rotated either by an electric motor connected to the pulley or manually from outside the evacuated housing. The operation for rotating the biprism wire has been described thus far.

The case where the biprism wire 22 is heated by supplying electrical current to the wire so as to remove contamination from the wire is next described. During observation of electron-beam interference fringes, if the image quality is deteriorated because the biprism wire is contaminated, then the switch $S_1$ is closed and the switch $S_2$ is opened without changing the orientation of the biprism wire 22. Since the bottom surfaces of the U-shaped electrodes 19 and 21 touch the fourth electrode plate 14 and the first electrode plate 8, respectively, as mentioned previously, if the switch $S_1$ is closed, electrical current from the power supply 10 used for heating flows through the second electrode plate 9, the first electrode plate 8, the U-shaped electrode 21, the biprism wire 22, the U-shaped electrode 19 and the fourth electrode plate 14 in this order. As a result, the wire 22 is heated by the flowing current. Consequently, the biprism wire 22 is decontaminated.

If the observation of the electron-beam interference fringes are restarted after the above-described heating, the switch $S_2$ is closed and the switch $S_1$ is opened without varying the orientation of the biprism wire. Because the bottom surface of the U-shaped electrode 19 contacts the fourth electrode plate 14, if the switch $S_2$ is closed, a positive voltage, for example, of about 100 V, is applied to the biprism wire 22 from the voltage source 11 via the fourth electrode plate 14 and the U-shaped electrode 19 irrespective of the orientation of the biprism wire 22 as described above. Thus, the electron-beam interference fringes are observed. In this way, in the present invention, the biprism wire can be heated by electrically energizing it without changing the orientation of the biprism wire irrespective of the orientation of the wire. After the removal of the contamination from the biprism wire, the electron-beam interference fringes can be immediately observed without adjusting the orientation of the biprism wire.

Figure 3A:
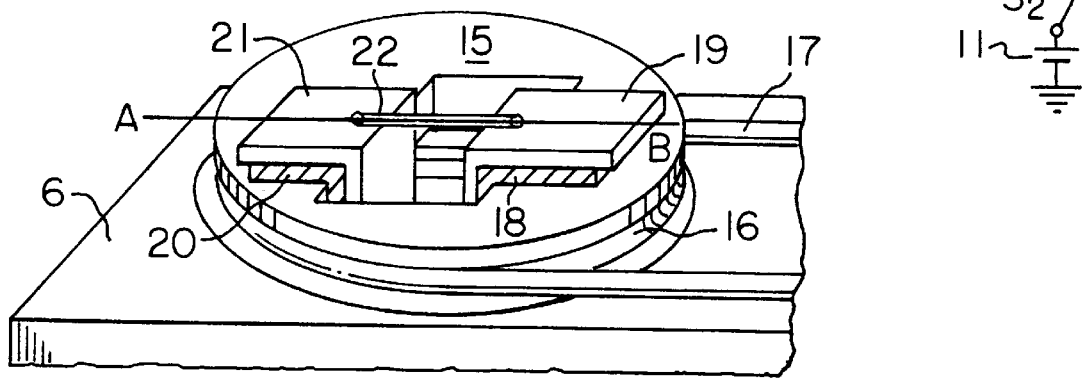
FIG. 3(a) is a perspective view of another electron-beam biprism according to the present invention.
Figure 3B:
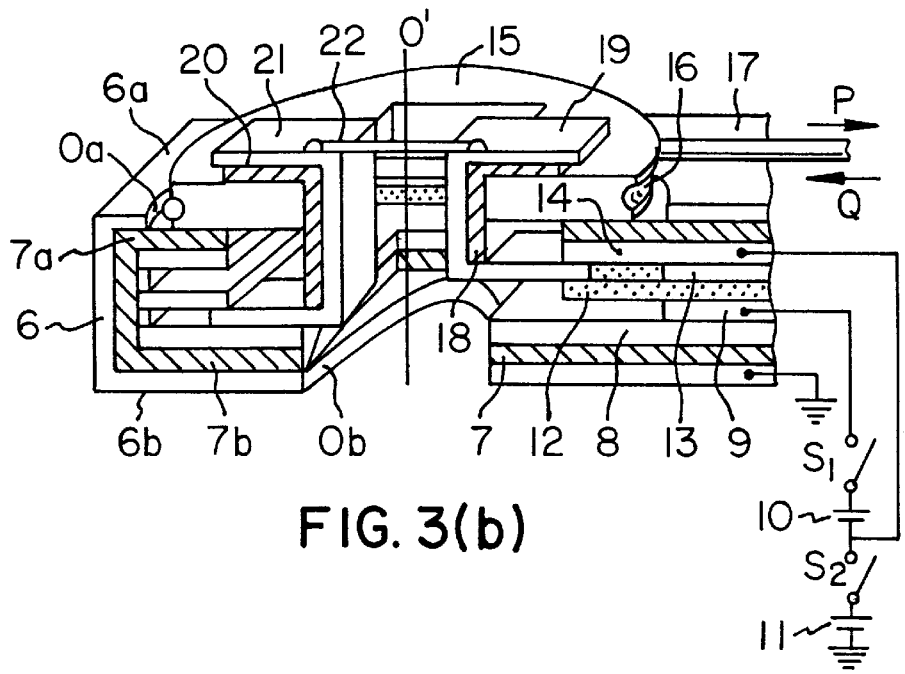
FIG. 3(b) is a cross-sectional view taken on line A–B of FIG. 3(a).

Referring to FIGS. 3(a) and 3(b), there is shown another electron-beam biprism according to the invention. It is to be noted that like components are indicated by like reference numerals in various figures. The electron-beam biprism shown in FIGS. 3(a) and 3(b) is similar to the electron-beam biprism described already in connection with FIGS. 2(a) and 2(b), except that the grounding electrodes are not fixedly mounted to the rotary plate. Also, in the electron-beam biprism shown in FIGS. 3(a) and 3(b), the grounding electrodes are contacted with the rotating cable 17 that is kept at ground potential so that the grounding electrodes are held at ground potential. In the electron-beam biprism shown in FIGS. 3(a) and 3(b), the rotary plate 15 kept at ground potential acts as the aforementioned grounding electrodes.

While two embodiments of the invention have been described, the invention is not limited thereto. In the above-described two embodiments, the bottom surfaces of the U-shaped electrodes 19 and 20 are kept in contact with the electrode plates 14 and 8, respectively, and, therefore, the biprism wire 22 can be heated by electrically energizing it, irrespective of the orientation of the biprism wire 22. In a modified embodiment, only certain portions of the electrode plates 14 and 8 form electrodes; the remaining portions are made of an insulating material. The biprism wire 22 is heated by electrically energizing it only when the biprism wire 22 is oriented in a given direction.

In the two embodiments described above, the U-shaped electrodes are connected with the power supply used for heating via their respective electrode plates. Alternatively, the U-shaped electrodes may be connected with the power supply via conductive lead wires. In this case, in order to prevent the conductive lead wires from breaking during rotation of the rotary plate, it is necessary to elongate the conductive lead wires or to limit the angular range of the rotation of the rotary plate to ±180° about a certain reference orientation.

Furthermore, the insulating plates 7 and 12 may be formed integrally. In addition, the holes in the insulating member 7, insulating plate 12, and first through fourth electrode plates may be shaped circularly. Further, the heating of the biprism wire may be done prior to the observation of the image or throughout the observation.

One electron-beam biprism according to the present invention is designed to be used with an instrument using an electron beam and comprises: a rotary plate provided with a hole permitting passage of the electron beam; a biprism wire mounted to the rotary plate and bridging across the hole, the biprism wire being electrically insulated from the rotary plate; a holder by which the rotary plate is rotatably held so as to be rotatable about the hole; a means for rotating the rotary plate; a means for heating the biprism wire; a means for applying a voltage to the biprism wire; and grounding electrodes extending parallel to the biprism wire and mounted to the rotary plate in such a way that the biprism wire is sandwiched between the grounding electrodes. Another electron-beam biprism according to the present invention is designed to be used with an instrument using an electron beam and comprises: a rotary plate provided with a hole permitting passage of the electron beam; a biprism wire mounted to the rotary plate and bridging across the hole, the biprism wire being electrically insulated from the rotary plate; a holder by which the rotary plate is rotatably held so as to be rotatable about the hole; a means for rotating the rotary plate; a means for heating the biprism wire; and a means for applying a voltage to the biprism wire. The rotary plate is grounded. In the novel structures having features as described above, the biprism wire can be heated and decontaminated without hindering the operation of the mechanism for rotating the biprism wire.

Having thus described our invention with the detail and particularity required by the Patent Laws, what is desired and claimed to be protected by Letters Patent is set forth in the following claims.

What is claimed is:

1. An electron-beam biprism for use with an instrument using an electron beam, said electron-beam biprism comprising:

a rotary plate provided with a hole permitting passage of said electron beam;

a biprism wire mounted to said rotary plate and bridging across said hole, said biprism wire being electrically insulated from said rotary plate;

a holder by which said rotary plate is rotatable held so as to be rotatable about said hole;

a means for rotating said rotary plate;

a means for heating said biprism wire;

a means for applying a voltage to said biprism wire; and grounding electrodes extending parallel to said biprism wire and mounted to said rotary plate in such a way that said biprism wire is sandwiched between said grounding electrodes, wherein said means for rotating said rotary plate comprises a cable trained around said rotary plate and a means for moving said cable, and wherein said rotary plate is rotated by moving said cable.

2. The electron-beam biprism of claim 1, wherein said means for heating said biprism wire comprises electrodes connected with both ends of said biprism wire and mounted to said rotary plate and a means connected with said electrodes via conductive leads acting to apply a voltage to said electrodes, and wherein said biprism wire is heated by passing electrical current through said wire.

3. An electron-beam biprism for use with an instrument using an electron beam, said electron-beam biprism comprising:

a rotary plate provided with a hole permitting passage of said electron beam;

a biprism wire mounted to said rotary plate and bridging across said hole, said biprism wire being electrically insulated from said rotary plate;

a holder by which said rotary plate is rotatable held so as to be rotatable about said hole;

a means for rotating said rotary plate;

a means for heating said biprism wire;

a means for applying a voltage to said biprism wire; and grounding electrodes extending parallel to said biprism wire and mounted to said rotary plate in such a way that said biprism wire is sandwiched between said grounding electrodes, wherein said means for heating said biprism wire comprises a first electrode pair with said biprism wire connected thereacross and said first electrode pair mounted to said rotary plate, a second electrode pair, each electrode thereof mounted to said holder so as to slidably touch a first electrode, and a means for applying a voltage to said second electrode pair, and wherein said biprism wire is heated by passing electrical current through said wire.

4. An electron-beam biprism for use with an instrument using an electron beam, said electron-beam biprism comprising:

a rotary plate provided with a hole permitting passage of said electron beam, said rotary plate being grounded;

a biprism wire mounted to said rotary plate and bridging across said hole, said biprism wire being electrically insulated from said rotary plate;

a holder by which said rotary plate is rotatable held so as to be rotatable about said hole;

a means for rotating said rotary plate;

a means for heating said biprism wire; and a means for applying a voltage to said biprism wire, wherein said means for rotating said rotary plate comprises a cable trained around said rotary plate and a means for moving said cable, and wherein said rotary plate is rotated by moving said cable.

5. The electron-beam biprism of claim 4, wherein said means for heating said biprism wire comprises electrodes connected with both ends of said biprism wire and mounted to said rotary plate and a means connected with said electrodes via conductive leads acting to apply a voltage to said electrodes, and wherein said biprism wire is heated by passing electrical current through said wire.

6. An electron-beam biprism for use with an instrument using an electron beam, said electron-beam biprism comprising:

a rotary plate provided with a hole permitting passage of said electron beam, said rotary plate being grounded;

a biprism wire mounted to said rotary plate and bridging across said hole, said biprism wire being electrically insulated from said rotary plate;

a holder by which said rotary plate is rotatable held so as to be rotatable about said hole;

a means for rotating said rotary plate;

a means for heating said biprism wire; and a means for applying a voltage to said biprism wire, wherein said means for heating said biprism wire comprises a first electrode pair with said biprism wire connected thereacross and said first electrode pair mounted to said rotary plate, a second electrode pair each electrode thereof mounted to said holder so as to slidably touch a first electrode, and a means for applying a voltage to said second electrode pair, and wherein said biprism wire is heated by passing electrical current through said wire.

* * * * *

UNITED STATES PATENT AND TRADEMARK OFFICE
CERTIFICATE OF CORRECTION

PATENT NO. : 5,811,806
DATED : September 22, 1998
INVENTOR(S) : Toshikazu Honda et al.

It is certified that error appears in the above-identified patent and that said Letters Patent is hereby corrected as shown below:

Title Page, under [73] Assignee "Jeol" should read --JEOL--.

Title Page, under [56] References Cited, U.S. PATENT DOCUMENTS, refer to Patent No. 4,998,788: Inventor's name "Osakakabe" should read --Osakabe--.

Column 1 Line 34 "4eextend" should read --4e extend--.

Claim 1 Column 6 Line 48 "is rotatable held" should read --is rotatably held--.

Claim 3 Column 7 Line 9 "rotatable held" should read --rotatably held--.

Claim 4 Column 7 Line 36 "rotatable held" should read --rotatably held--.

Claim 6 Column 8 Line 23 "rotatable held" should read --rotatably held--.

Signed and Sealed this

Twenty-third Day of February, 1999

Attest:

Q. TODD DICKINSON

*Attesting Officer*      *Acting Commissioner of Patents and Trademarks*